United States Patent
Tsai et al.

(10) Patent No.: US 6,703,311 B2
(45) Date of Patent: Mar. 9, 2004

(54) METHOD FOR ESTIMATING CAPACITANCE OF DEEP TRENCH CAPACITORS

(75) Inventors: Tzu-Ching Tsai, Taichung Hsien (TW); Hui Min Mao, Tainan Hsien (TW); Ying Huan Chuang, Taoyuan Hsien (TW); Yu-Pi Lee, Taipei Hsien (TW)

(73) Assignee: Nanaya Technology Corporation, Taoyuan (TW)

( * ) Notice: Subject to any disclaimer, the term of this patent is extended or adjusted under 35 U.S.C. 154(b) by 50 days.

(21) Appl. No.: 10/163,240

(22) Filed: Jun. 4, 2002

(65) Prior Publication Data

US 2003/0087527 A1 May 8, 2003

(30) Foreign Application Priority Data

Nov. 6, 2001 (TW) .......................................... 090127508

(51) Int. Cl.[7] ............................................. H01L 21/302
(52) U.S. Cl. ....................... 438/694; 438/696; 438/700; 438/723; 438/725
(58) Field of Search ................................ 438/694, 696, 438/700, 708, 723, 725

(56) References Cited

U.S. PATENT DOCUMENTS

| | | | | | |
|---|---|---|---|---|---|
| 5,405,800 | A | * | 4/1995 | Ogawa et al. | 438/253 |
| 5,729,043 | A | * | 3/1998 | Shepard | 257/519 |
| 6,010,933 | A | * | 1/2000 | Cherng | 438/253 |
| 6,031,289 | A | * | 2/2000 | Fulford et al. | 257/758 |
| 6,281,068 | B1 | * | 8/2001 | Coronel et al. | 438/243 |
| 6,353,253 | B2 | * | 3/2002 | Hause et al. | 257/510 |

* cited by examiner

Primary Examiner—Nadine G. Norton
Assistant Examiner—Binh X. Tran
(74) Attorney, Agent, or Firm—Ladas & Parry

(57) ABSTRACT

A method for estimating capacitance of deep trench capacitor in a substrate. After a photoresist layer used to define the region of the lower electrode is formed on an oxide layer doping with a conducting type dopant, the height difference of the photoresist layer between the memory cell array area and the supporting area is measured. The radicand of the height difference is directly proportional to a capacitance of a capacitor to-be-formed in the trenches.

3 Claims, 2 Drawing Sheets

METHOD FOR ESTIMATING CAPACITANCE OF DEEP TRENCH CAPACITORS

BACKGROUND OF THE INVENTION

1. Field of the Invention

This invention relates to a method for estimating capacitance of deep trench capacitors. In particular, the present invention relates to a method of estimating capacitance before finishing the capacitors.

2. Description of the Related Art

DRAM is capable of read and write operations. Unlike other types of memory, each DRAM cell needs only one transistor and one capacitor, therefore it is easy to achieve high integration and wide use in computers and electric equipment. The trench capacitor is a commonly used capacitor, formed in the substrate. The capacitance of the trench capacitor is usually increased by increasing the depth of the trench capacitor.

The trench capacitor memory chip can be separated into a memory cell array area and a support area. The memory cell array area is used to store data, and the support area places some logic circuit and some decoupling capacitors to filter noise.

After forming the capacitors, a wafer acceptance test (WAT) is used to measure the capacitance of the formed deep trench capacitor. Further, after finishing second layer of interconnection, a deep trench short loop (DTSL) is used to test the capacitance, open circuit and leakage of the capacitors. However, these two ways cannot monitor the capacitance before forming the capacitor. If the capacitance is below standard value and detected after DTSL test, the wafer cannot recover and must be discarded.

SUMMARY OF THE INVENTION

The object of the present invention is to provide a method for estimating capacitance of deep trench capacitors before finishing the capacitors.

To achieve the above-mentioned object, a method for estimating capacitance of deep trench capacitor in a substrate is provided. The substrate includes a memory cell array area and a supporting area. A plurality of trenches is formed in the memory cell array area. A conformal oxide layer is formed in the substrate, wherein the conformal oxide layer is doped with a first conducting type dopant. After a photoresist layer used to define the region of the lower electrode is formed on an oxide layer doping with a conducting type dopant, the height difference of the photoresist layer between the memory cell array area and the supporting area is measured. The radicand of the height difference is directly proportional to a capacitance of a capacitor to be formed in the trenches.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

For estimating capacitance before forming a capacitor, a method of estimating capacitance by measuring the height difference of photoresist layer between the memory cell array area and the support area is proposed.

The memory cell array area 12 is used to store data, and the support area places some logic circuits to operate the data storing in the memory cell array area 12.

Figure 1:
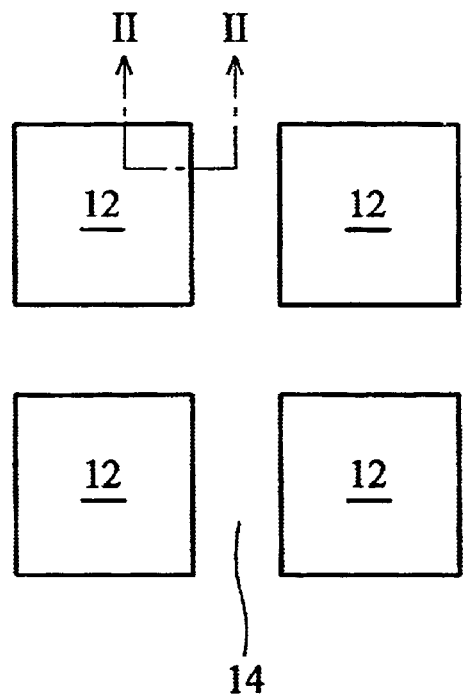
FIG. 1 is a top view of a substrate including a memory cell array area and a support area.
Figure 2A:
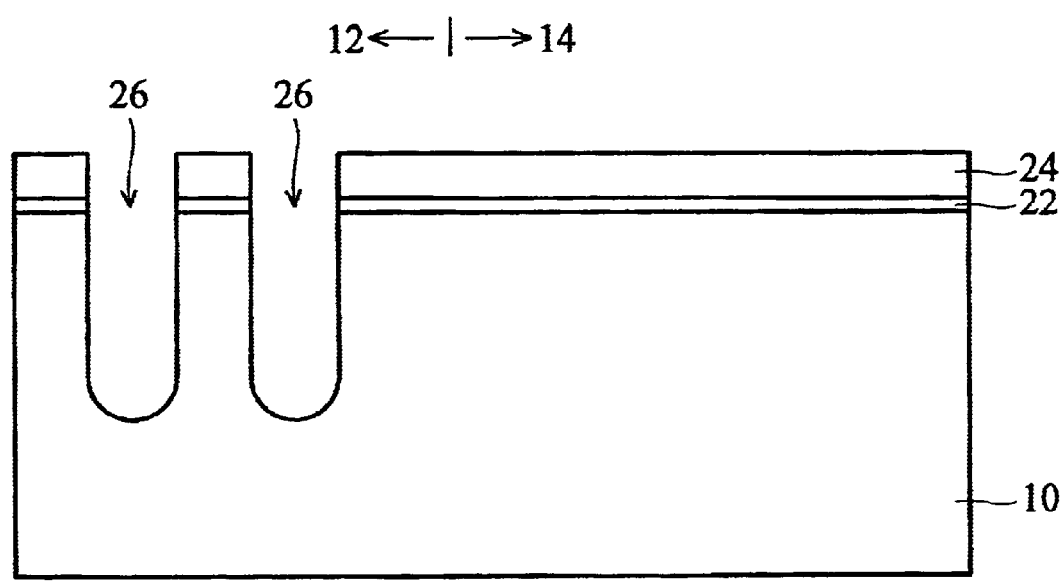
FIGS. 2A~2C are cross sections of II—II in FIG. 1.
Figure 2B:
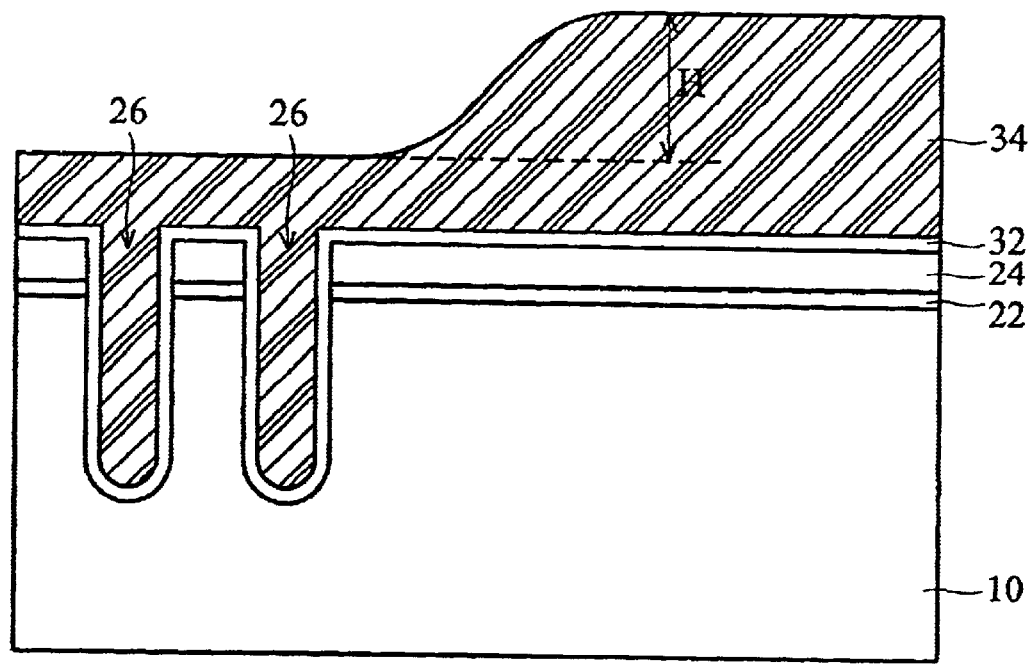
Figure 2C:
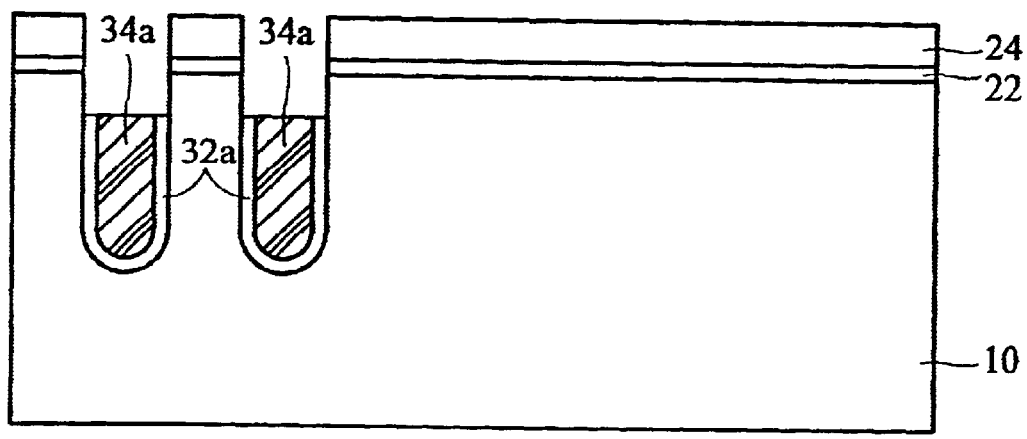

FIGS. 2A~2C are cross sections depicting the method for forming the trench capacitors in the memory cell array area 12.

Referring to FIG. 2A, a substrate 10, such as silicon semiconductor substrate, is provided. A pad oxide layer 22 and a mask layer 24 are formed in the substrate 10. The material used to form the mask layer 24 can be silicon nitride. The mask layer 24 is patterned by photolithography and etching. The patterned mask layer 24 has a trench pattern. The pattern in the mask layer 24 is transferred into the underlying pad oxide layer 22 and the substrate 10 to form a lot of trenches 26 in array in the memory cell array area 12. Only some trenches are laid out for decoupling capacitors in the supporting area 14, however, these trenches do not affect the invention so are not shown.

Referring to FIG. 2B, a conformal oxide layer 32 is formed on the mask layer 24 and the trenches 26. The conformal oxide layer 32 is doped with a conducting dopant, such as P or As. A photoresist layer 34 is then formed on the conformal oxide layer 32.

After the photoresist material is coated on the oxide layer 32 by spin coating, the photoresist material does not fill the trenches 26 yet. The photoresist material is then subjected to baking, resulting in the photoresist layer 34 (as shown in figure) reflowing into the trenches 26. The trenches 26 are arranged in dense array, and much photoresist material flows therethrough. After baking, the height of the photoresist layer 34 in the memory cell array area 12 is lower than that in the supporting area 14, and a height difference between these two areas 12 and 14, therefore, results.

The height difference between the memory cell array area 12 and the supporting area 14 is measured, and is marked as H. The radicand of the height difference H is directly proportional to a capacitance of the capacitors to be formed in the trenches.

After controlling the factors, such as the thickness of the pad oxide layer 22, the mask layer 24 and the conformal oxide layer 32 and the amount of the photoresist layer 34 to be removed, the capacitance of the capacitors can be estimated by calculating the radicand of the height difference H between areas 12 and 14.

If the estimated capacitance is within a permissible range, the following processes are carried out.

Referring to FIG. 2C, the oxide layer 32 is transferred to 32a to define the lower electrodes region. The oxide layer 32a is defined by removing parts of the photoresist layer 34 to become the photoresist layer 34a only filling in the trenches 26 and then removing the oxide layer 32 not covered by the remaining photoresist layer 34a.

The following capacitor process is carried out and does not affect the present invention. Its detailed description is not needed.

After researching, it is found that the radicand ($H^{1/2}$) of the height difference H of the photoresist layer 34 between the memory cell array area 12 and the supporting area 14 is related to the capacitance of the capacitors formed in the trenches 26. The detail description is given below.

Three etching conditions used to etch the trenches 26 are shown in Table 1, and the other factors as mentioned below are controlled.

The thickness of the photoresist layer 34 in the supporting area 14 is 2.8 μm;
   the depth of the trenches 26 (included the thickness of the mask layer 0.2 μm) is 7.2 μm;
   the thickness of the oxide layer 32 (32a) in the side wall of the trenches 26 is 150 Å; and
   the distance between the surface of the substrate 10 and the top of the lower electrode is 1.1 μm.

The height difference H of the photoresist layer 34 between the memory cell array area 12 and the supporting area 14 under each etching condition is measured, and listed in Table 1, and the reference capacitance measured by DTSL is also listed in Table 1.

TABLE 1

| Etching condition | H | Capacitance measured by DTSL |
|---|---|---|
| $SF_6 + NF_3$ (I) | 0.75 μm | 40.4 fF |
| $SF_6 + NF_3$ (II) | 0.94 μm | 45.4 fF |
| $SF_6$ | 1.20 μm | 51.1 fF |

In Table 1, (I) and (II) mean different concentrations of $NF_3$. The ratio of $H^{1/2}$ based on the above H is 1:1.098:1.218, which is approximately equal to the ratio of the capacitance measured by DTSL 1:1.124:1.265.

In conclusion, the above-mentioned method is used to estimate the capacitance during the deep trench capacitor process. The capacitance is estimated by measuring the height difference of the photoresist layer, which is used to define the region of the lower electrode.

Therefore, the magnitude of the capacitance is easily and quickly controlled, and this method is very suitable for estimating the capacitance in developing next generation of capacitors.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for estimating capacitance of deep trench capacitor in a substrate which includes a memory cell array area and a supporting area, comprising:
   forming a plurality of trenches in the memory cell array area of the substrate;
   forming a conformal oxide layer in the substrate, wherein the conformal oxide layer is doped with a first conducting type dopant;
   forming a photoresist layer on the oxide layer and in the trenches; and
   measuring the height difference of the photoresist layer between the memory cell array area and the supporting area, wherein the radicand of the height difference is directly proportional to a capacitance of a capacitor to be formed in the trenches.

2. A method for estimating capacitance of deep trench capacitor, comprising:
   providing a substrate which includes a memory cell array area and a supporting area;
   forming a patterned mask layer on the substrate;
   transferring a pattern in the patterned mask layer into the substrate to form a plurality of trenches in the memory cell array area of the substrate;
   forming a conformal oxide layer in the substrate, wherein the conformal oxide layer is doped with a first conducting type dopant;
   forming a photoresist layer on the oxide layer and in the trenches; and
   measuring the height difference of the photoresist layer between the memory cell array area and the supporting area, wherein the radicand of the height difference is directly proportional to the capacitance of a capacitor to be formed in the trenches.

3. The method as claimed in claim 2, wherein the material used to form the patterned mask layer is silicon nitride.

* * * * *